United States Patent
Stenzel et al.

(10) Patent No.: US 9,119,162 B2
(45) Date of Patent: Aug. 25, 2015

(54) PARALLEL ARRANGEMENT OF ASYNCHRONOUS BUCK CONVERTERS FOR ADVANCED POWER CAPABILITY

(71) Applicant: QUALCOMM Incorporated, San Diego, CA (US)

(72) Inventors: Adrian M Stenzel, San Diego, CA (US); Todd R Sutton, Del Mar, CA (US); Narendra Singh Mehta, Santa Clara, CA (US); Siegfried W Breitmeier, San Diego, CA (US); Gordon P Lee, Gilbert, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 13/770,734

(22) Filed: Feb. 19, 2013

(65) Prior Publication Data
US 2014/0235299 A1 Aug. 21, 2014

(51) Int. Cl.
| | |
|---|---|
| *H04B 1/38* | (2015.01) |
| *G05F 1/00* | (2006.01) |
| *H04W 52/02* | (2009.01) |
| *G06F 1/26* | (2006.01) |
| *H02J 1/10* | (2006.01) |
| *H05K 1/02* | (2006.01) |

(Continued)

(52) U.S. Cl.
CPC .......... *H04W 52/0296* (2013.01); *G06F 1/263* (2013.01); *H02J 1/102* (2013.01); *H04W 52/0277* (2013.01); *G05F 1/66* (2013.01); *H02M 2001/0045* (2013.01); *H05K 1/0254* (2013.01)

(58) Field of Classification Search
CPC ............ H02J 1/10; H02J 1/102; H02J 1/108; H02J 1/12; H02J 9/00; H02J 9/04; H02M 3/156; H02M 3/1582; H02M 3/1584; G06F 1/26; G06F 1/28; G06F 1/32; G06F 1/3203; G06F 1/3206; H05K 1/0254; H05K 1/0262; G05F 1/66; G05F 3/02
USPC ........ 455/571, 572, 574, 343.1, 343.5, 343.6; 323/282, 284, 285; 307/80, 85, 86
See application file for complete search history.

(56) References Cited

U.S. PATENT DOCUMENTS

| | | | |
|---|---|---|---|
| 4,194,147 A | | 3/1980 | Godsey et al. |
| 5,552,643 A | * | 9/1996 | Morgan et al. .................. 307/81 |
| 6,144,115 A | * | 11/2000 | Massie et al. .................. 307/80 |

(Continued)

OTHER PUBLICATIONS

International Search Report and Written Opinion—PCT/US2014/016090—ISA/EPO—Jun. 26, 2014.

*Primary Examiner* — Duc M Nguyen
(74) *Attorney, Agent, or Firm* — Arent Fox LLP

(57) ABSTRACT

A method and apparatus for extending the driving capacity of a power management device are provided. The method involves determining an energy requirement for the operation of a power management device. Next, the method compares the energy requirement for the operation of a power management device with a capability of a first power device. If the energy requirement is greater than the energy requirement of the first power device, the energy is switched to a second power device of higher capacity. The apparatus includes: a first power device; a second power device connected in parallel to the first power device; a first inductor connected to the first power device and a capacitor connected to the first inductor; and a second inductor connected to a second power device and a capacitor connected to the second inductor.

18 Claims, 3 Drawing Sheets

(51) Int. Cl.
*G05F 1/66* (2006.01)
*H02M 1/00* (2007.01)

(56) References Cited

U.S. PATENT DOCUMENTS

| | | | |
|---|---|---|---|
| 7,679,410 B1* | 3/2010 | Steinbrecher | 327/108 |
| 7,925,906 B2 | 4/2011 | Ranganathan et al. | |
| 2001/0007134 A1 | 7/2001 | Odaohhara | |
| 2001/0022513 A1 | 9/2001 | Nokkonen | |
| 2002/0041178 A1 | 4/2002 | Hiraki et al. | |
| 2002/0167827 A1 | 11/2002 | Umeda et al. | |
| 2003/0090244 A1 | 5/2003 | Shenai et al. | |
| 2004/0027099 A1 | 2/2004 | Fujii | |
| 2004/0196019 A1* | 10/2004 | Schneider | 323/285 |
| 2004/0201931 A1* | 10/2004 | Korcharz et al. | 361/18 |
| 2005/0001597 A1* | 1/2005 | Walters et al. | 323/222 |
| 2005/0289375 A1* | 12/2005 | Ranganathan et al. | 713/300 |
| 2006/0201724 A1* | 9/2006 | Leblanc | 180/65.1 |
| 2007/0015475 A1* | 1/2007 | Schoofs et al. | 455/127.1 |
| 2008/0076484 A1 | 3/2008 | Veselic | |
| 2008/0122417 A1* | 5/2008 | Ng et al. | 323/282 |
| 2008/0158918 A1 | 7/2008 | Hunter | |
| 2009/0302826 A1* | 12/2009 | Kim et al. | 323/318 |
| 2010/0033151 A1* | 2/2010 | Wu et al. | 323/285 |
| 2010/0308661 A1* | 12/2010 | Garcia et al. | 307/80 |
| 2011/0022826 A1* | 1/2011 | More et al. | 713/1 |
| 2011/0022859 A1 | 1/2011 | More et al. | |
| 2012/0047382 A1 | 2/2012 | Barnes et al. | |
| 2012/0126771 A1* | 5/2012 | Tuten | 323/284 |
| 2012/0176196 A1* | 7/2012 | Khlat | 330/127 |
| 2012/0260109 A1 | 10/2012 | Zhai et al. | |

* cited by examiner

PARALLEL ARRANGEMENT OF ASYNCHRONOUS BUCK CONVERTERS FOR ADVANCED POWER CAPABILITY

BACKGROUND

1. Field

The present disclosure relates generally to power delivery for wireless communication systems, and more particularly, to a parallel arrangement of asynchronous buck converters for advanced power capability

2. Background

Wireless communication systems are widely deployed to provide various types of communication content such as voice, data, and so on. These systems may be multiple-access systems capable of supporting communications with multiple users by sharing the available system resources (e.g., bandwidth and transmit power). Examples of such multiple-access systems include code division multiple access (CDMA) systems, time division multiple access (TDMA) systems, frequency division multiple access (FDMA), 3GPP Long Term Evolution (LTE) systems, and orthogonal frequency division multiple access (OFDMA) systems, and Universal Mobile Telecommunications (UMTS) systems.

Regardless of which wireless system the mobile phone operates on, power management is critical to the correct operation. The power supply must be able to supply on demand the necessary current for each function and application. Design of the power management integrated circuit (PMIC) is a crucial part of mobile device design. As wireless devices perform more and more operations and run ever increasing applications, efficient power management becomes much more important.

Modern cellular phones support multiple carriers and modes of operation. In addition, many phones are capable of running a variety of specialized applications for additional services and capabilities. All of these added features and functionality require power, and the level of power needed may fluctuate depending on the functions and applications running at a given time. These variable needs complicate the selection and operation of the cellular phone's power supply.

During the design process it is common for the current consumption of the load to increase late in the platform development process. A load may be a cell phone processor (MSM), or any other load driven by voltage and current, having a mathematical relationship. This increase may force a redesign of the PMIC, which is a costly and time consuming process that may delay release of a product.

There is a need in the art for a method an apparatus for "upgrading" an existing PMIC solution to provide higher current without completely redesigning the PMIC.

SUMMARY

Embodiments disclosed herein provide a method and apparatus for extending the driving capacity of a power management device. The method involves determining an energy requirement for the operation of a power management device. Next, the method compares the energy requirement for the operation of a power management device with a capability of a first power device. If the energy requirement is greater than the energy requirement of the first power device, the energy is switched to a second power device of higher capacity.

A further embodiment provides an apparatus for extending the driving capacity of a power management device. The apparatus includes: a first power device; a second power device connected in parallel to the first power device; a first inductor connected to the first power device and a capacitor connected to the first inductor; and a second inductor connected to a second power device and a capacitor connected to the second inductor.

A still further embodiment provides an apparatus for extending the driving capacity of a power management device. The apparatus comprises: means for determining an energy requirement for operation of a power management device; means for comparing the energy requirement for the operation of the power management device with a capability of the first power device; and means for switching energy delivery to a second power device of higher capacity if the energy requirement is greater than the energy requirement of the first power device.

Yet a further embodiment provides a non-transitory computer-readable medium containing instructions, which when executed by a processor, cause the processor to perform the steps of: determining an energy requirement for operation of a power management device; comparing the energy requirement for the operation of the power management device with a capability of a first power device; and switching energy delivery to a second power device of higher capacity if the energy requirement is greater than the energy requirement of the first power device.

DETAILED DESCRIPTION

Figure 1:
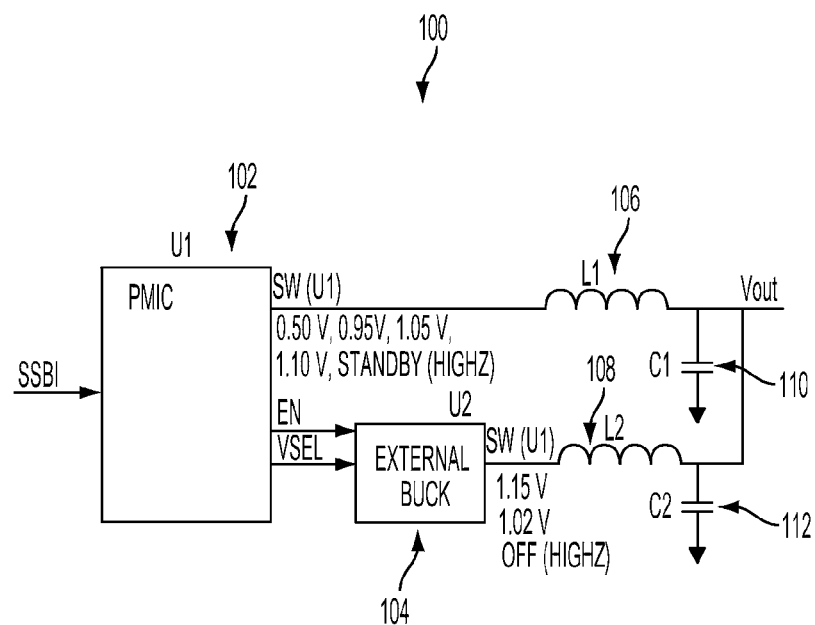
FIG. 1 depicts the PMIC chip and external buck regulator according to an embodiment of the disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

An existing PMIC may be "upgraded" to provide higher current by adding an appropriate external buck regulator. This embodiment preserves the existing power saving features on the PMIC while providing for an increased current capacity only when needed. This allows for better cooling as well, since the higher current which generates additional heat, is not always "on". This is achieved by using two buck converters in parallel. Buck 1 (PMIC) delivers the energy for the normal or "non-turbo" operating modes. Buck 2, which is external to the PMIC, is activated (turbo mode) whenever high performance is required. The buck providing the higher output voltage supplies all the output current for the processor or load. The inactive buck automatically enters a standby mode because the combined output exceeds that buck's operating threshold.

A buck converter is a step-down DC to DC converter. The design is similar to a step up boost converter, and similar to the boost converter, it is a switched mode power supply that uses two switches, which are a transistor and a diode, as well as an inductor and a capacitor.

The simplest way to reduce the voltage of a DC supply is to use a linear regulator, however this may lead to an increase in heat, as linear regulators dissipate excess power as heat. Buck converters are quite efficient, possibly as high as 95% for integrated circuits, and are often used to convert a main voltage down to a lesser value needed by a specific component, such as a processor.

In operation the buck converter consists of an inductor and two switches that control the inductor. The buck converter alternates between connecting the inductor to source voltage in order to store energy in the inductor, and discharging the inductor into the load.

The key concept of a buck converter is that an inductor is "reluctant" to allow a change in current. When the switch is in the "off" position, the current in the circuit is zero. When the switch is first closed, the current begins to increase, however, the inductor is reluctant to change from zero, and attempts to counteract the increase by dropping the voltage. This voltage drop counteracts the voltage of the source and therefore reduces the net voltage across the load. Over time, the inductor allows the current to increase slowly by decreasing the voltage it drops and therefore increasing the voltage seen by the load. During this time the inductor stores energy in the form of a magnetic field.

If the switch is opened before the inductor is fully charged, then there will always be a voltage drop across the inductor, so the net voltage seen by the load will always be less than the input voltage source.

The concept of the buck is applied to embodiments described here and is discussed in more detail below.

FIG. 1 shows the PMIC chip and the external buck regulator used to temporarily increase the current provided to the load. The assembly 100 includes PMIC 102 and external buck 104. PMIC 102 provides input to inductor 106. Inductor 106 provides an output voltage, and is also connected to ground through capacitor 110. External buck 104 provides input to inductor 108. Inductor 108 contributes to the output voltage produced. Inductor 108 is also connected to ground through capacitor 112. Ground pin inputs and outputs provide the connections between PMIC 102 (having designator U1) and external buck regulator 104. Defined load shifts are performed by changing the buck voltage settings during operation.

Figure 2:
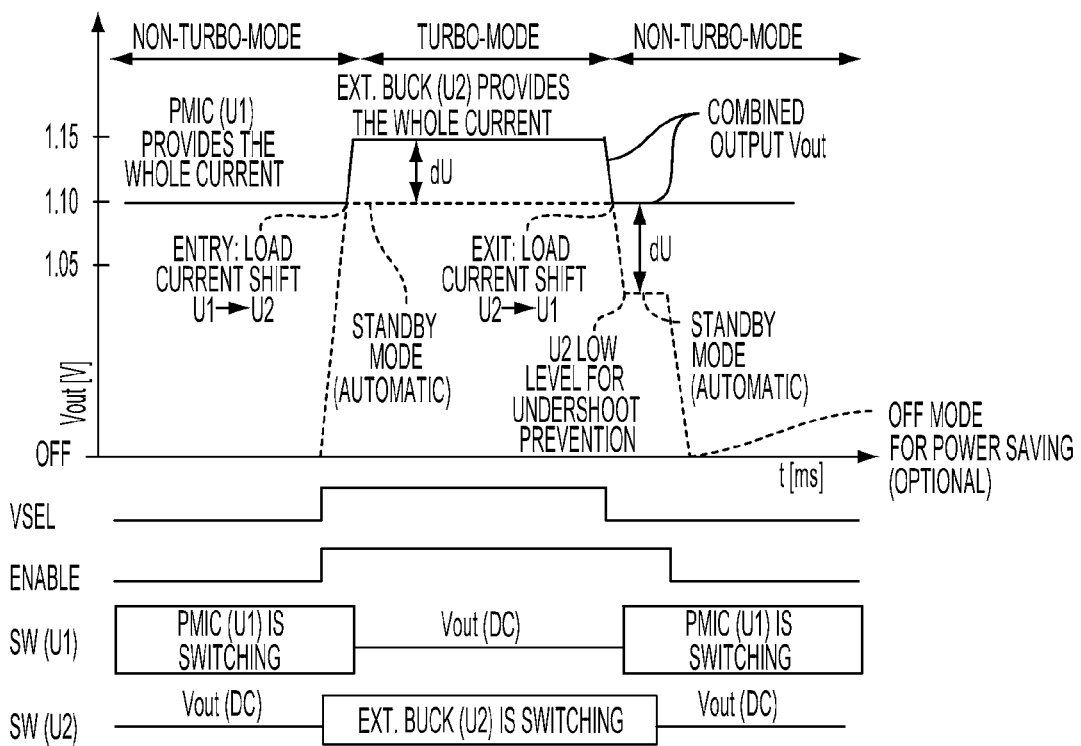
FIG. 2 illustrates the shift from non-turbo mode to turbo mode and back to non-turbo mode, according to an embodiment of the disclosure.

FIG. 2 illustrates the shift from non-turbo mode to turbo mode and back to non-turbo mode. As shown in FIG. 2, in non-turbo mode, PMIC 102 provides the whole current needed by the load. The load shift begins when the external buck 104 reaches the same output voltage and pushes the combined output to a higher level. The load shift ends when the external buck 104 provides the entire current and PMIC 102 goes into standby mode (High Z).

Once the need for the additional current, or turbo mode, is over, external buck 104 begins stepping down its voltage. This voltage step-down occurs in two stages in order to protect the common output voltage node from undershoots in voltage. PMIC 102 automatically leaves standby mode and takes over supplying the load current.

Smooth current shifts from PMIC 102 to external buck 104 (entry sequence) are required, while the reverse is true for the exit sequence. This is accomplished by using two output voltages of the external buck. These output voltages are selected to be slightly above and slightly below the PMIC 102 values. This prevents interaction between the two independent working blocks. This voltage margin, dU, ensures stability. Output current may be provided during the entire entry to exit sequence without interruption.

If both the PMIC 102 and the external buck 104 were providing the same output voltage, current sharing could occur. This results in increased ripple found on the output voltage. This may be avoided by having the PMIC 102 and external buck 104 provide different output voltages. If the external buck 104 is completely switched off without using a lower level setting, a critical voltage undershoots may occur. This voltage undershoot is caused by the reactivation time of the PMIC 102.

The off state of the external buck 104 is optional and may be used for current saving. If fast or frequent changes between the turbo mode and the non-turbo mode are required, the external buck 104 may hold the low voltage level in order to be readily available when needed.

A further embodiment provides that the external buck 104 may be directly controlled by the PMIC 102, however, this control need not be exclusive to the PMIC 102.

A still further embodiment provides that external control may be provided by the main device processor.

Figure 3:
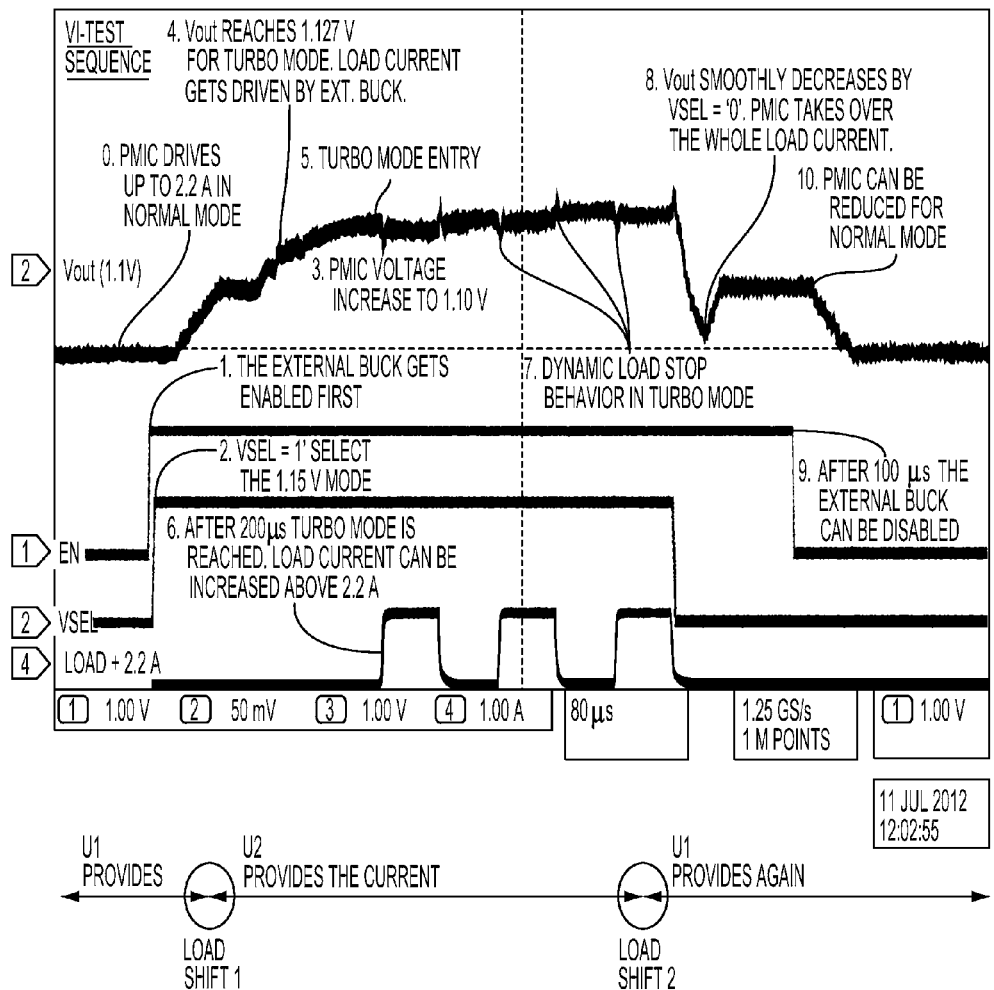
FIG. 3 shows the combined output voltage of the PMIC and the external buck regulator according to an embodiment of the disclosure.

FIG. 3 shows the combined output voltage of the PMIC 102 and the external buck 104 (U1+U2) and also shows the control signals for the external buck 104 (U2). Before operation of the embodiments described herein commences, the PMIC 102 drives the amperage up to a predetermined level in the normal mode. In step 1 the external buck 104 is enabled. In step 2 the activation signal and voltage selector, EN and VSEL, is set to activate the higher voltage mode. The PMIC 102 voltage is then increased to a predetermined level in step 3. This voltage is below the voltage level provided in the turbo mode. In step 4, the output voltage Vout reaches the turbo mode level. At that point the load current is driven by the external buck 104.

Entry into the turbo mode occurs in step 5. The turbo mode is ready in step 6 after passage of a predetermined amount of time, when the output voltage has stabilized. At this point the load current may be increased above the PMIC 102 operating value driven by the external buck 104. In step 7, operation is in the turbo mode and the load behaves dynamically. To leave the turbo mode, the Output voltage, Vout, is smoothly decreased by setting VSEL=0. In step 8 The PMIC 102 again takes over and provides the current to the load. The external buck 104 is switched off after a predetermined amount of time, in step 9. In step 10, the PMIC 102 is once again operating in the normal mode.

FIG. 3 illustrates that whenever the combined voltage output is above 1.1 volts, the external buck provides the current for the load. One of skill in the art would appreciate that the embodiments described herein may be adapted to over devices, with correspondingly different current and voltage requirements. The voltage and current values herein are provided solely as examples of the operation of the various embodiments and the embodiments are not to be construed as limited to the sample values presented.

Figure 4:
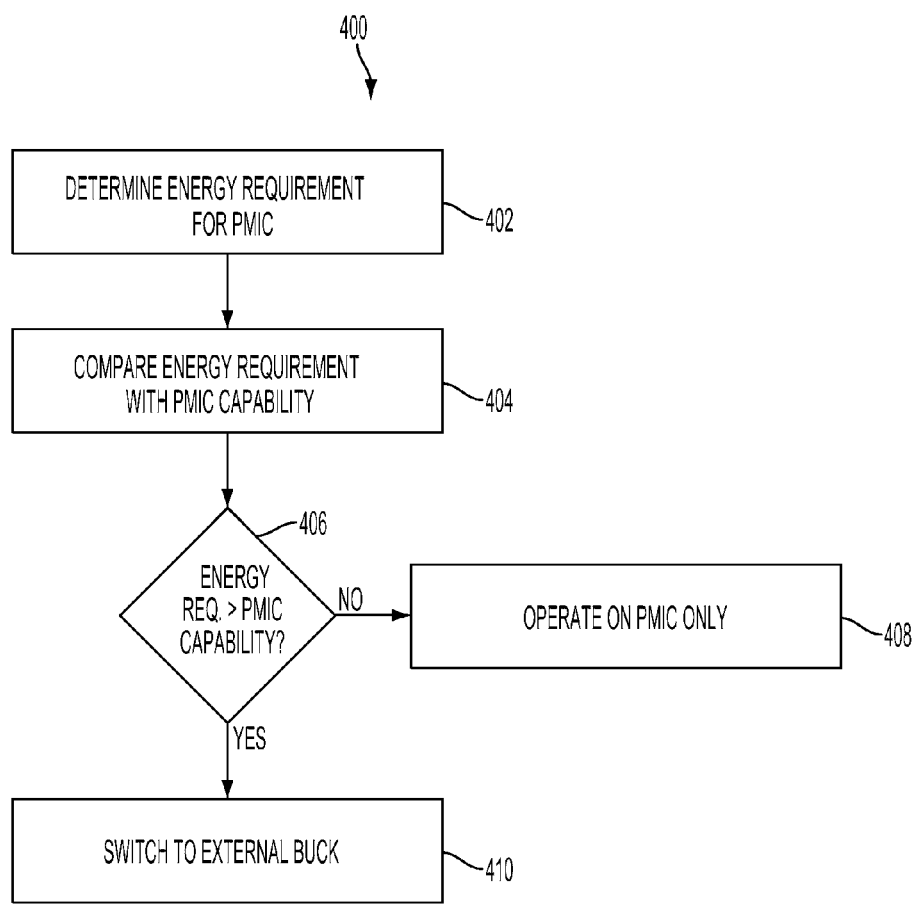
FIG. 4 is a flow diagram of the shirt from non-turbo mode to turbo mode and back to non-turbo mode, according to an embodiment of the disclosure.

FIG. 4 provides a flowchart of a method of operation of a parallel arrangement of asynchronous buck converters for advanced power capabilities. The method 400 begins with determining the energy requirement for PMIC in step 402. This energy requirement is then compared with the capabilities of the PMIC in step 404. In step 406 it is determined whether the energy requirements are greater than the capabilities of the PMIC. If the energy requirements are not greater than the PMIC capability, then operation is only on the PMIC in step 408. If the energy requirements are greater than the capability of the PMIC, then power delivery is switched to the external buck in step 410.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for extending driving capacity of a power management device, comprising:
    determining an energy requirement for operation of a load via the power management device;
    comparing the energy requirement for the operation of the load with a capability of a first power device included in a power management integrated circuit (PMIC);
    switching energy delivery to a second power device of higher capacity if the energy requirement is greater than the capability of the first power device, wherein the second power device is external to the PMIC; and
    utilizing the first power device without the second power device for the operation of the load if the energy requirement is not greater than the capability of the first power device,
    wherein the second power device is held in standby mode at a low voltage level when frequent switching is required.

2. The method of claim 1, wherein the first power device becomes inactive once the second power device is activated.

3. The method of claim 1, wherein the second power device supplies the output current for the load.

4. The method of claim 1, wherein switching energy delivery begins when the second power device of higher capacity reaches an output voltage of the power management device.

5. The method of claim 4, wherein switching energy delivery ends when the second power device provides all current to a load.

6. The method of claim 1, wherein the second power device is controlled by the power management device.

7. An apparatus for extending driving capacity of a power management device, comprising:
    a first power device included in a power management integrated circuit (PMIC);
    a second power device connected in parallel to the first power device, wherein the second power device is external to the PMIC and is configured to receive a signal from the PMIC to activate a higher voltage mode via the second power device;
    a first inductor connected to the first power device and a capacitor connected to the first inductor; and
    a second inductor connected to the second power device and a capacitor connected to the second inductor,
    wherein the second power device is held in standby mode at a low voltage level when frequent switching is required.

8. The apparatus of claim 7, wherein at least one of the capacitor connected to the first inductor or the capacitor connected to the second inductor is a common capacitor at the voltage output node.

9. The apparatus of claim 7, wherein the first power devices comprises a buck regulators.

10. An apparatus for extending driving capacity of a power management device, comprising:
    means for determining an energy requirement for operation of a load via the power management device;

means for comparing the energy requirement for the operation of the load with a capability of a first power device included in a power management integrated circuit (PMIC);

means for switching energy delivery to a second power device of higher capacity if the energy requirement is greater than the capability of the first power device, wherein the second power device is external to the PMIC;

means for utilizing the first power device without the second power device for the operation of the load if the energy requirement is not greater than the capability of the first power device; and means for holding the second power device in standby mode at a low voltage level when frequent switching is required.

11. The apparatus of claim 10, wherein the means for switching energy delivery includes means for inactivating the power management device once the second power device is activated.

12. The apparatus of claim 10, wherein the means for switching energy delivery begins when the second power device of higher capacity reaches an output voltage of the power management device.

13. The apparatus of claim 10, wherein the means for switching energy delivery is controlled by the power management device.

14. A non-transitory computer-readable medium containing instructions, which when executed by a processor, cause the processor to perform the steps of:

determining an energy requirement for operation of a load via the power management device;

comparing the energy requirement for the operation of the load with a capability of a first power device included in a power management integrated circuit (PMIC);

switching energy delivery to a second power device of higher capacity if the energy requirement is greater than the capability of the first power device, wherein the second power device is external to the PMIC;

utilizing the first power device without the second power device for the operation of the load if the energy requirement is not greater than the capability of the first power device; and holding the second power device is held in standby mode at a low voltage level when frequent switching is required.

15. The non-transitory computer-readable medium of claim 14, further comprising:

instructions for inactivating the power management device once the second power device is activated.

16. The non-transitory computer-readable medium of claim 14, further comprising:

instructions for initiating switching energy delivery when the second power device of higher capacity reaches an output voltage of the power management device.

17. The non-transitory computer-readable medium of claim 14, further comprising:

instructions for ending switching energy delivery when the second power device provides all current to a load.

18. The non-transitory computer-readable medium of claim 14, further comprising:

instructions for controlling the second power device by the power management device.

\* \* \* \* \*